United States Patent
Oschmann et al.

Patent Number: 5,724,168
Date of Patent: Mar. 3, 1998

[54] WIRELESS DIFFUSE INFRARED LAN SYSTEM

[75] Inventors: Ellen L. Oschmann, Winnetka; Jeffrey Peter Welch, Libertyville, both of Ill.

[73] Assignee: Spectrix Corporation, Deerfield, Ill.

[21] Appl. No.: 322,016

[22] Filed: Oct. 11, 1994

[51] Int. Cl.$^6$ .................................. H04B 10/00
[52] U.S. Cl. ...................... 359/172; 359/152; 359/159
[58] Field of Search .......................... 359/118, 152, 359/188, 189, 172, 161, 159; 330/308, 59; 250/214 A, 551, 349

[56] References Cited

U.S. PATENT DOCUMENTS

| | | |
|---|---|---|
| 3,971,943 | 7/1976 | Jeunehomme et al. .......... 250/372 |
| 4,717,913 | 1/1988 | Elger .............................. 359/172 |
| 4,864,651 | 9/1989 | Ogiwara et al. ................ 359/189 |
| 4,977,618 | 12/1990 | Allen ............................. 359/172 |
| 5,091,648 | 2/1992 | Owers et al. ................... 250/342 |
| 5,099,346 | 3/1992 | Lee et al. ....................... 359/118 |
| 5,107,120 | 4/1992 | Tom .............................. 250/342 |
| 5,218,356 | 6/1993 | Knapp ............................ 359/118 |
| 5,297,144 | 3/1994 | Gilbert et al. .................. 359/118 |
| 5,311,353 | 5/1994 | Crawford ....................... 359/189 |
| 5,319,201 | 6/1994 | Lee ............................... 250/349 |
| 5,321,542 | 6/1994 | Freitas et al. .................. 359/152 |
| 5,340,993 | 8/1994 | Salina et al. ................... 250/551 |
| 5,410,282 | 4/1995 | Larrick et al. ................. 359/118 |
| 5,416,627 | 5/1995 | Wilmoth ........................ 359/152 |
| 5,424,859 | 6/1995 | Vehara et al. .................. 359/152 |
| 5,526,161 | 6/1996 | Suzuki et al. .................. 359/159 |
| 5,528,391 | 6/1996 | Elrod ............................. 359/159 |

OTHER PUBLICATIONS

Graeme, "Circuit options boost photodiode bandwidth", EDN-Design Feature, May 21, 1992, pp. 155-161.

*Primary Examiner*—Leo Boudreau
*Assistant Examiner*—Bhavesh Mehta
*Attorney, Agent, or Firm*—Welsh & Katz, Ltd.

[57] ABSTRACT

A wireless diffuse infrared local area network communication system is provided for enclosed areas. The communication system includes a controller and a substantially omnidirectional infrared transceiver disposed on an inside walls of the enclosed area operatively interconnected with the controller. The system further includes a remote station and means, operatively coupled to the remote station, for transceiving a communicated signal with the substantially omnidirectional infrared transceiver.

5 Claims, 14 Drawing Sheets

FIG. 4a

RSYNC-Request Sync
MRSYNC-Mandatory Request Sync

| INFO (34) | |
|---|---|
| Preamble | |
| SD | |
| DID | < Broadcast |
| SID | < ID of originating controller |
| Type | < RSYNC or MRSYNC |
| Control | < Control flags: AP |
| Version | < Software version |
| TotalSlots | < Total number of time slots in SyncPeriod (including RegSlots) |
| RegSlots | < Total number of time slots which are for registration only |
| SuperFrame | < Superframe number |
| FCS | |
| ED | |

DSYNC-Data Sync

| INFO (34) | |
|---|---|
| Preamble | |
| SD | |
| DID | < Broadcast |
| SID | < ID of originating controller |
| Type | < DSYNC |
| Control | < Control flags: AP |
| UpLength | < length of Upward Data Period |
| SuperFrame | < Superframe number |
| FCS | |
| ED | |

EDSYNC-Extended Data Sync

| INFO (34) | |
|---|---|
| Preamble | |
| SD | |
| DID | < Broadcast |
| SID | < ID of originating controller |
| Type | < DSYNC |
| Control | < Control flags: AP |
| UpLength | < length of Upward Data Period |
| BCastLength | < length of Broadcast Data Period |
| DownLength | < length of Downward Data Period |
| ListLength | < length of following list |
| List | < list of stations for which there is downward data in this superframe |
| SuperFrame | < Superframe number |
| FCS | |
| ED | |

FIG. 4b

RegRTS-Registration Request

| Preamble |
|---|
| SD |
| DID | < Destination Station ID
| SID | < registration slot number ( temporary station ID)
| Type | < regRTS
| Control | < Control flags: none used
| Version | < Software version
| SA | < Address station registering, 48-bit address
| FCS |
| ED |

(34 / INFO)

RTS-Request To Send

| Preamble |
|---|
| SD |
| DID | < Destination Station ID
| SID | < Source Station ID
| Type | < RTS
| Control | < Control flags: AP, sequence, out-of-sequence, retry, more
| DataCount | < Number of data frames station wants to send to DA
| DataLength | < Length, in octets, of data the source wants to send
| DA | < Address station to which data is to be sent, 48-bit address
| FCS |
| ED |

(34 / INFO)

FORF-Forfeit

| Preamble |
|---|
| SD |
| DID | < Destination Station ID
| SID | < Source Station ID
| Type | < FORF
| Control | < Control flags: none used
| FCS |
| ED |

RegCTS-Registration Clear to Send

| Preamble |
|---|
| SD |
| DID | < Destination Staion ID
| SID | < ID of originating controller
| Type | < RegCTS
| Control | < Control flags: AP
| ID | < ID assigned to station
| SA | < Address station registering, 48-bit address
| FCS |
| ED |

(34 / INFO)

FIG. 4c

CTS-Clear To Send

| Preamble |
|---|
| SD |
| DID | < Destination Station ID
| SID | < Source Station ID
| Type | < CTS
| Control | < Control flags: AP, sequence, out-of-sequence
| FCS |
| ED |

DATA- Data

| Preamble |
|---|
| SD |
| DID | < Destination Station ID
| SID | < Source Station ID
| Type | < DATA
| Control | < Control flags: AP, sequence, out-of-sequence, retry, more
| SA | < Address of data originator, 48-bit address
| DataLength | < Length, in octets, of data to be sent
| Data | < Data
| FCS |
| ED |

34
INFO

MDATA-Management Data

| Preamble |
|---|
| SD |
| DID | < Destination Station ID
| SID | < Source Station ID
| Type | < MDATA
| Control | < Control flags: AP, sequence, out-of-sequence, retry, hierarchical
| SA | < Address of data originator, 48-bit address
| MType | < Type of management message
| Data | < according to MType
| FCS |
| ED |

34
INFO

Acknowledge

| Preamble |
|---|
| SD |
| DID | < Destination Station ID
| SID | < Source Station ID
| Type | < ACK
| Control | < Control flags: AP
| FCS |
| ED |

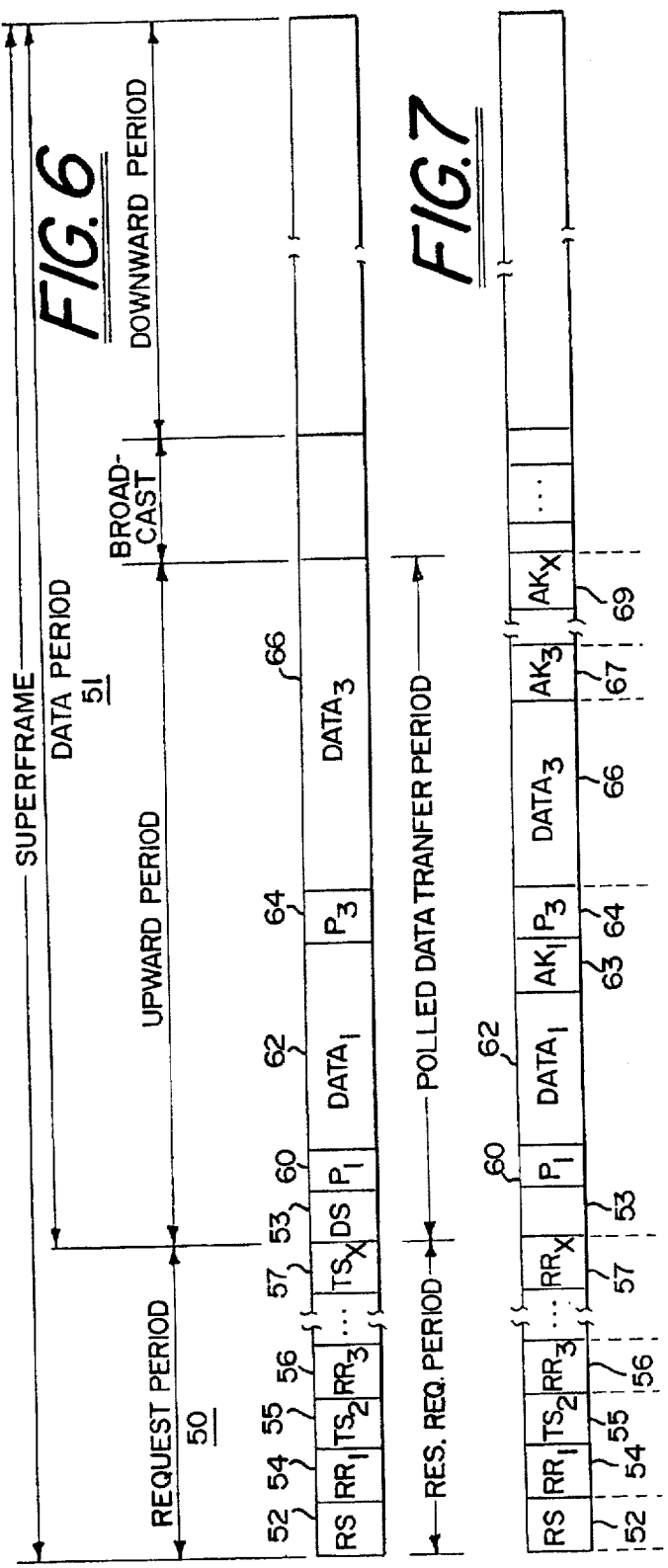

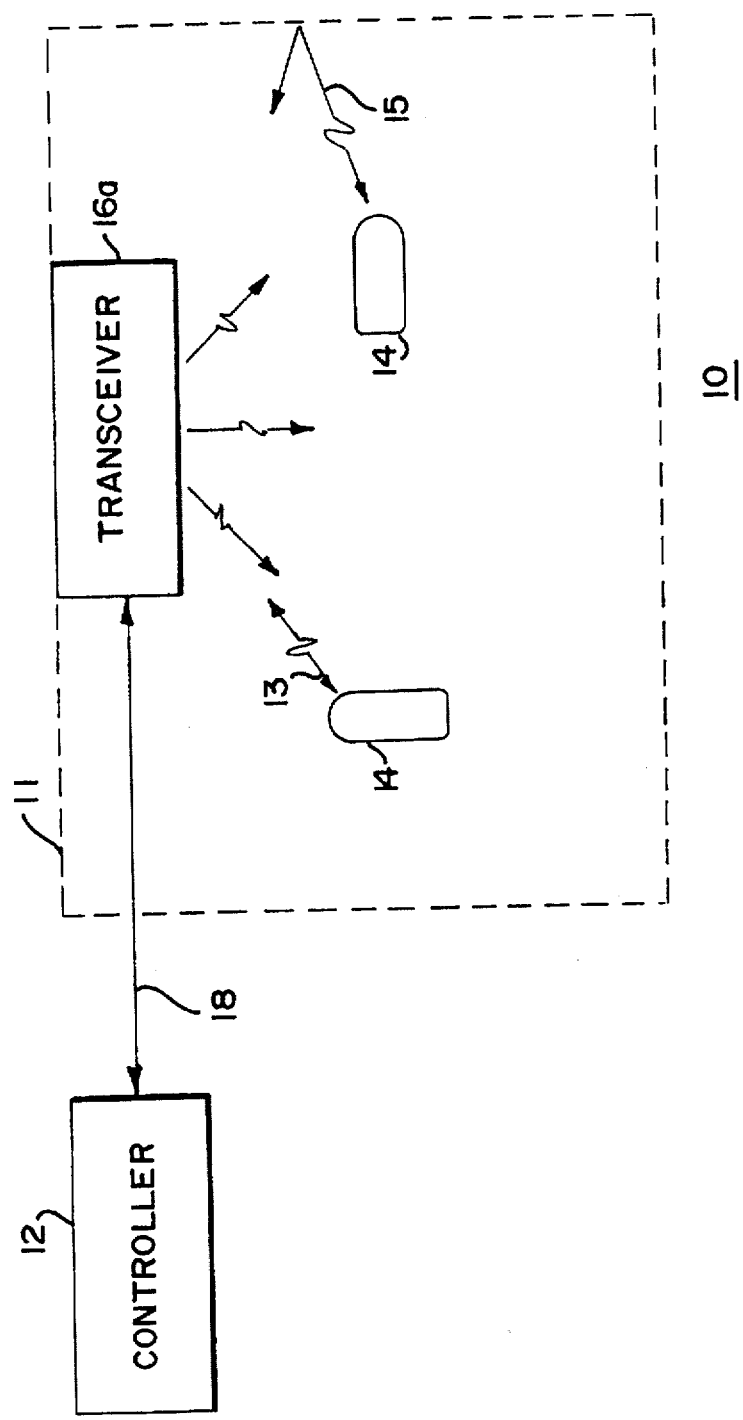

FIG. 14
FIG. 14a
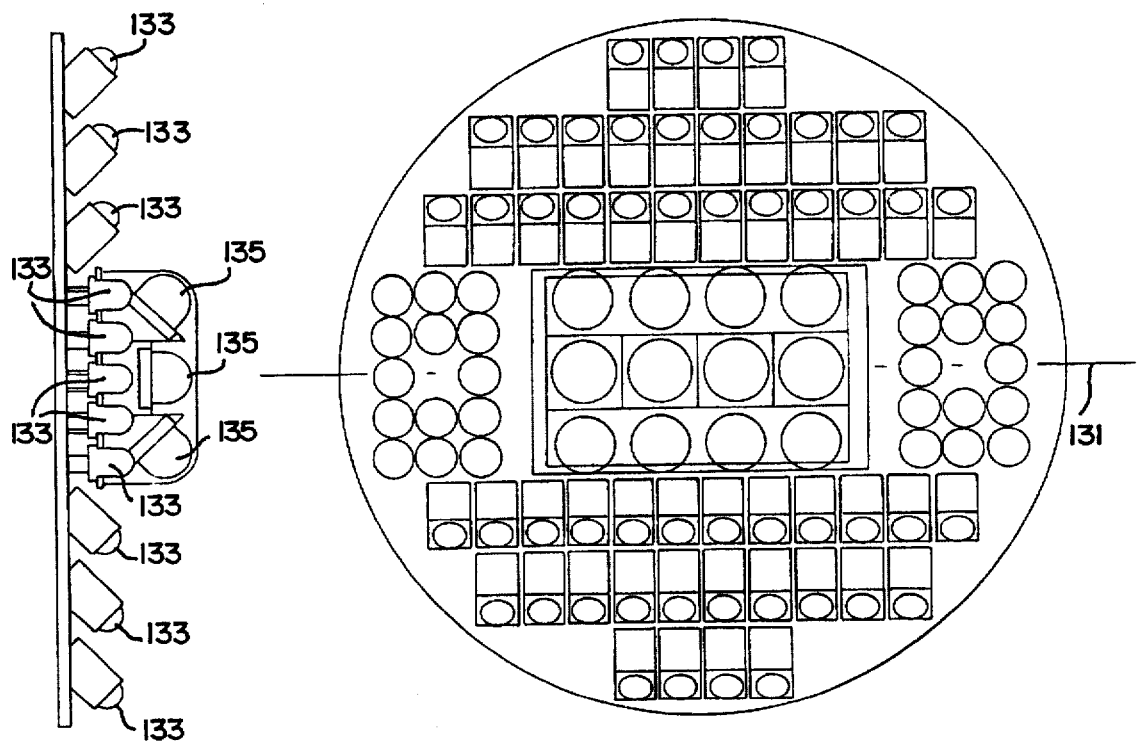
FIG. 14b
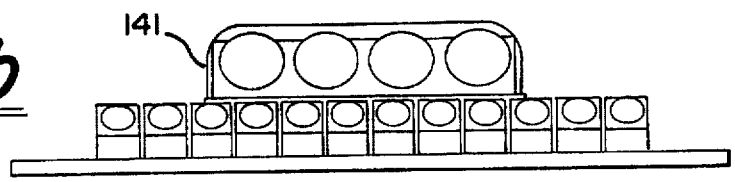

WIRELESS DIFFUSE INFRARED LAN SYSTEM

BACKGROUND OF THE INVENTION

This invention generally relates to the field of data communication networks. More particularly, this invention pertains to wireless local area networks (LANs) for a data communication network having a number of users exchanging data between individual remote stations and a central station over a single optical infrared channel.

A multipoint digital communication network typically consists of a number of remote stations which communicate with a central station over one or more two-way communication channels. For example, personal computers are typically connected to a wide variety of peripherals or other computers via wire cables, i.e., a hard-wired communication link. Moreover, local area networks (LANs) are often used to integrate remote terminals that are located at the same site. Depending upon the number of users, distance between terminals, number of peripherals, frequency of system reconfiguration, portability of the remote stations, etc., the hard-wired cable system may not be practical for a given application. Hence, various wireless communication technologies have been employed, particularly when a system includes a large number of users and/or portable, hand-held computer devices.

Among the more common wireless technologies are narrow-band radio frequency (RF) systems, spread spectrum RF, ultrasonic, and infrared optical. Radio frequency systems are often significantly degraded by electromagnetic noise and interference, as well as by large signal amplitude variations and multipath interference. Moreover, RF systems are typically subject to governmental licensing and regulation. Alternative wireless systems employing ultrasonic sound waves experience severe problems with the complete loss of signals due to nulls in the transmission path.

Optical-infrared communication, however, is not affected by electromagnetic interference, and is much less susceptible to multipath interference. Furthermore, optical systems are inherently secure (since the infrared light does not penetrate walls), have no known health or safety effects (at low power levels), and are not subject to F.C.C. regulation. Moreover, infrared transceivers draw relatively low currents, which is particularly important with respect to hand-held battery-powered portable computers. Thus, the use of infrared light as the wireless medium is well suited to such applications.

One practical infrared LAN was taught by Lee in U.S. Pat. No 5,099,346, (Lee) assigned to the assignee of the present invention. Under Lee a number of computers and peripherals (remote stations) were interconnected using an infrared optical communication system. While Lee worked well, the infrared devices of Lee were line-of-sight devices. Line-of-sight devices are not particularly well suited to palmtop computers or other data processing devices requiring great mobility. Because of the importance of mobile communication between data processing devices in enclosed areas and in the utility of palmtop computers in general, a need exists for a means of exchanging data between mobile and stationary data processing devices that is more flexible than line-of-sight devices and yet not susceptible to electromagnetic interference.

SUMMARY OF THE INVENTION

Accordingly, a primary object of the present invention is to provide a method for using existing infrared transmitting and receiving apparatus, but in an arrangement to enable the transceiving of infrared signals indirectly as well as line-of-sight.

A further and more particular object of this present invention is to provide a radiation filter for a photodiode detector of the transceivers which blocks radiation outside the infrared region thereby increasing sensitivity of the infrared receivers.

A further and more particular object of this present invention is to provide an infrared detector within an infrared receiver whose speed and performance is not dependent upon changes in signalling light levels.

These and other objects of the present invention are provided in an apparatus of the present invention of a diffuse infrared wireless local area system for enclosed areas. The communication system includes a controller and a substantially omnidirectional infrared transceiver disposed on an inside wall of the enclosed area operatively interconnected with the controller. The system further includes a remote station and means, operatively coupled to the remote station, for transceiving a communicated signal with the substantially omnidirectional infrared transceiver.

BRIEF DESCRIPTION OF THE APPENDIX AND DRAWINGS

The features of the present invention which are believed to be novel are set forth with particularity in the appended claims. The invention itself, however, together with further objects and advantages thereof, may best be understood with reference to the following description when taken in conjunction with the accompanying appendix and drawings, in which:

Appendix I is a description of operation (including flowcharts) of a Field Programmable Gate Array;

Figure 3:
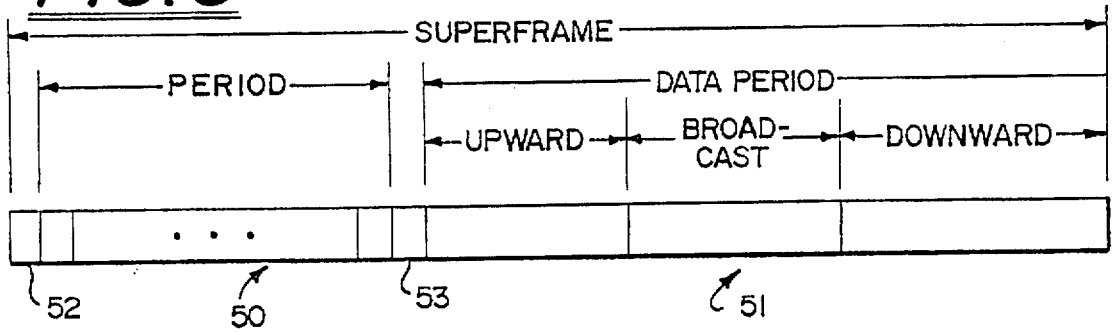
FIG. 3 is a timing cycle diagram illustrating the two-stage reservation-based polling protocol and data exchange system of the present invention.
Figure 5:
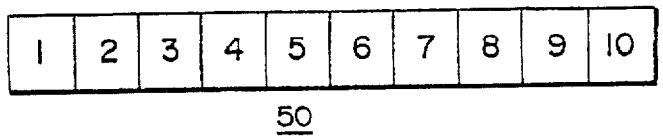

FIGS. 4A–C provide a summary of network control function by frame type in accordance with the invention along with a description of frame content within individual fields of the frame;

FIG. 5 depicts a slot arrangement used within the request period in accordance with the invention;

FIG. 6 is a timing cycle diagram similar to that of FIG. 3 illustrating slot usage.

Figure 1:
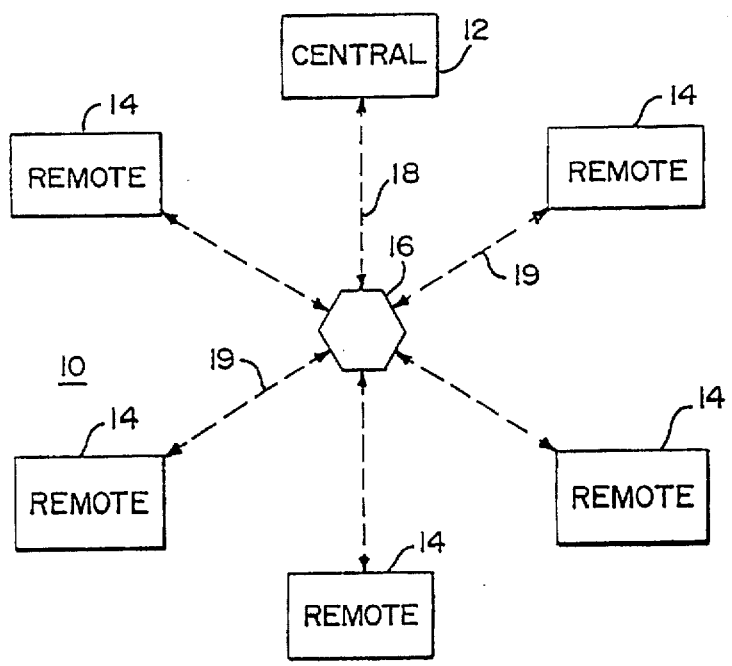
FIG. 1 is a general block diagram of the wireless data communication network according to the present invention.
Figure 9:
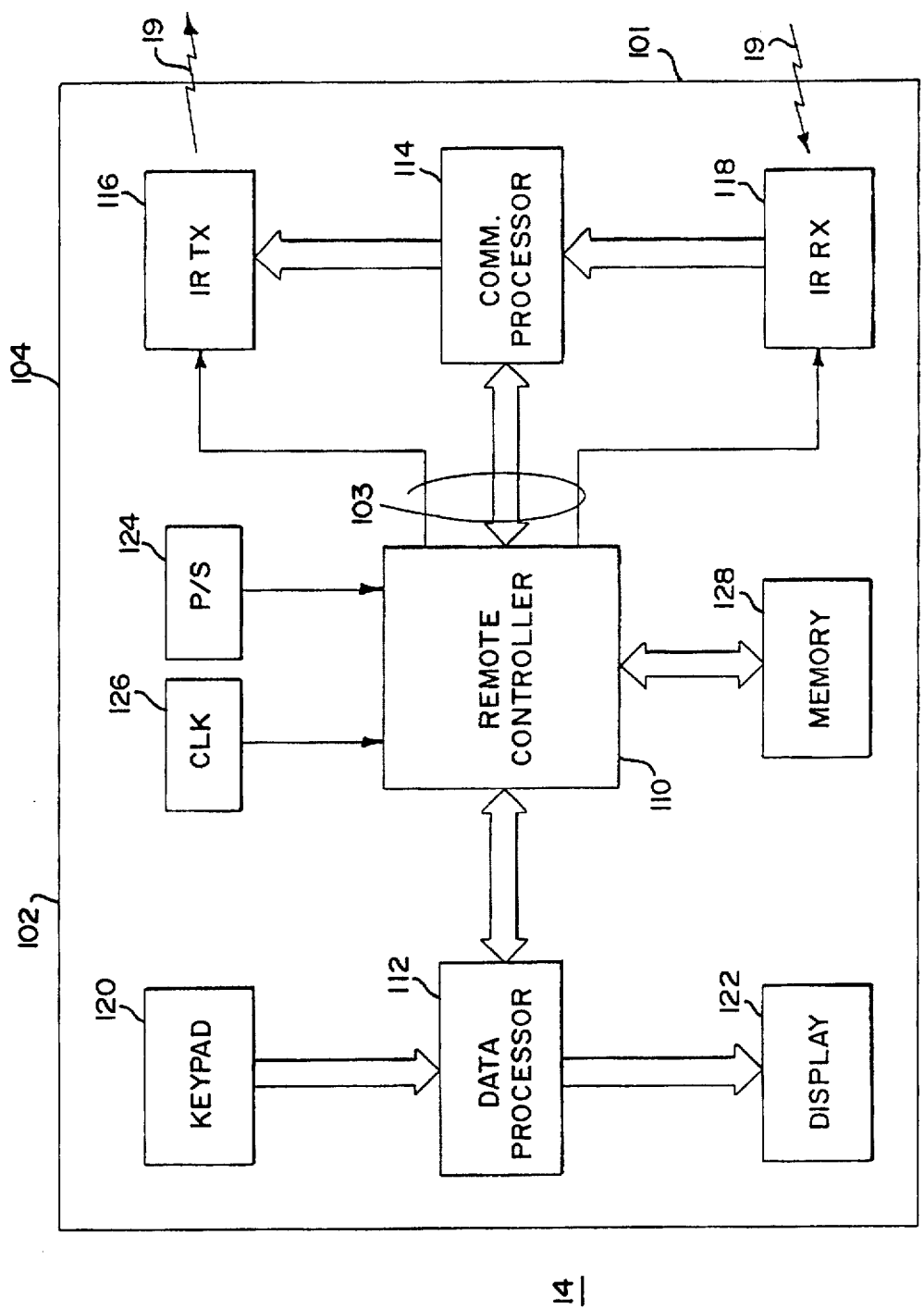
Figure 10:
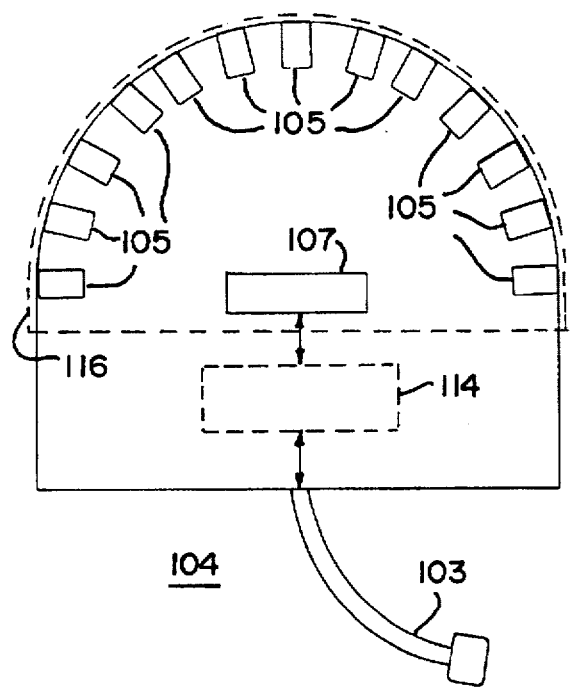
Figure 11:
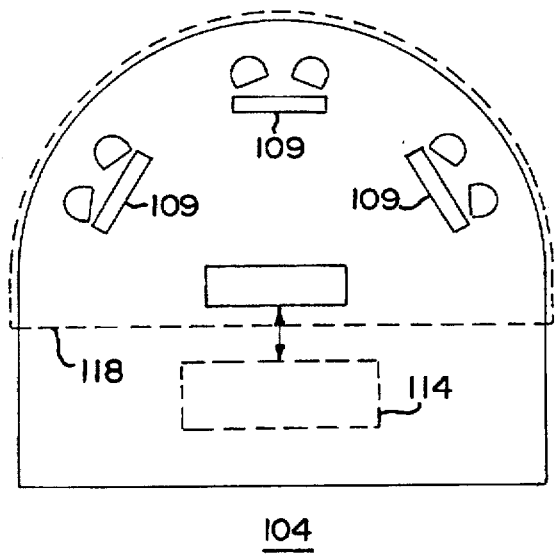
Figure 12:
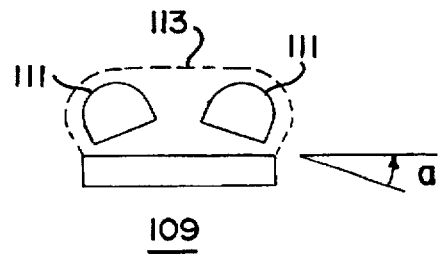
Figure 13:
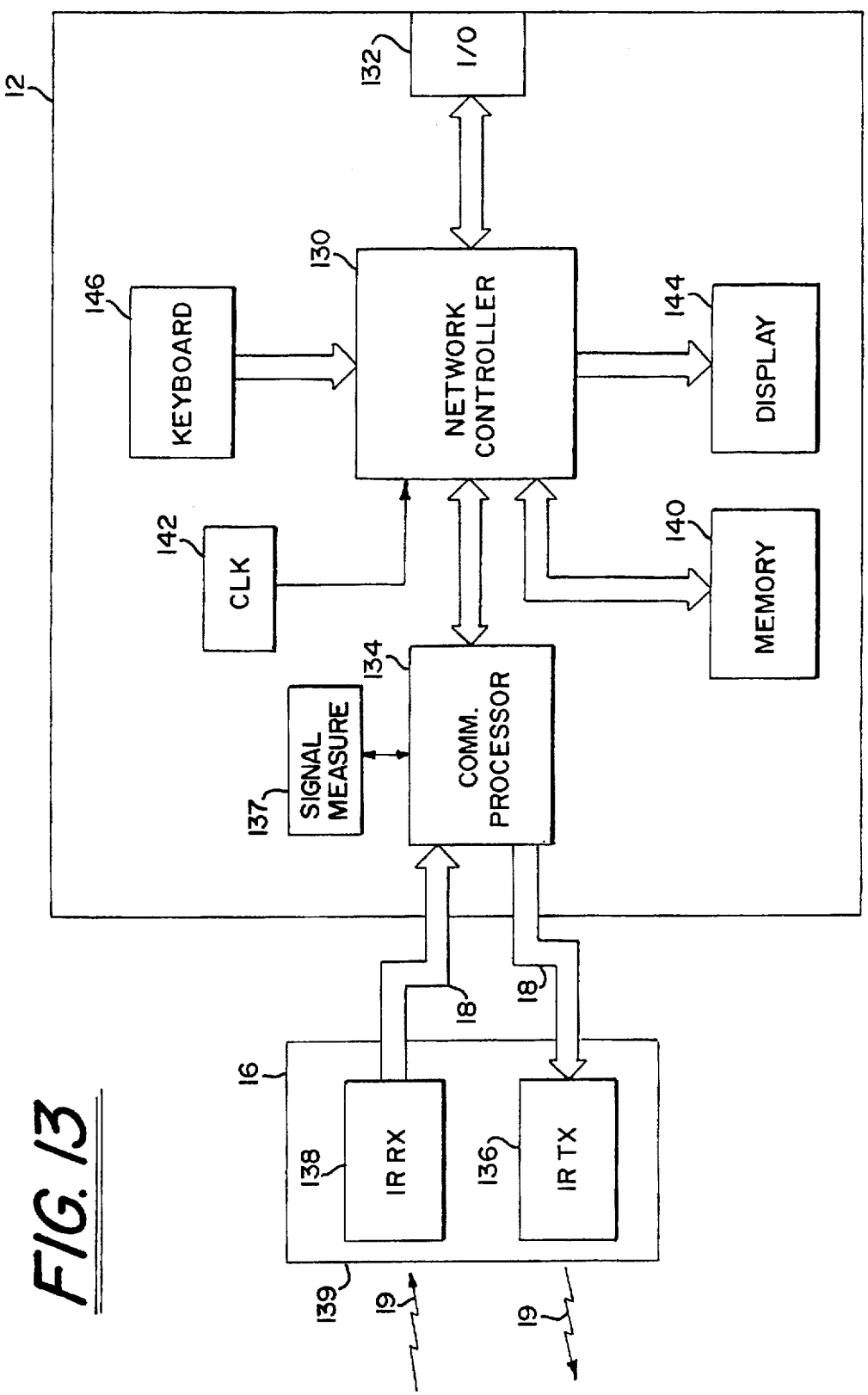
Figure 15:
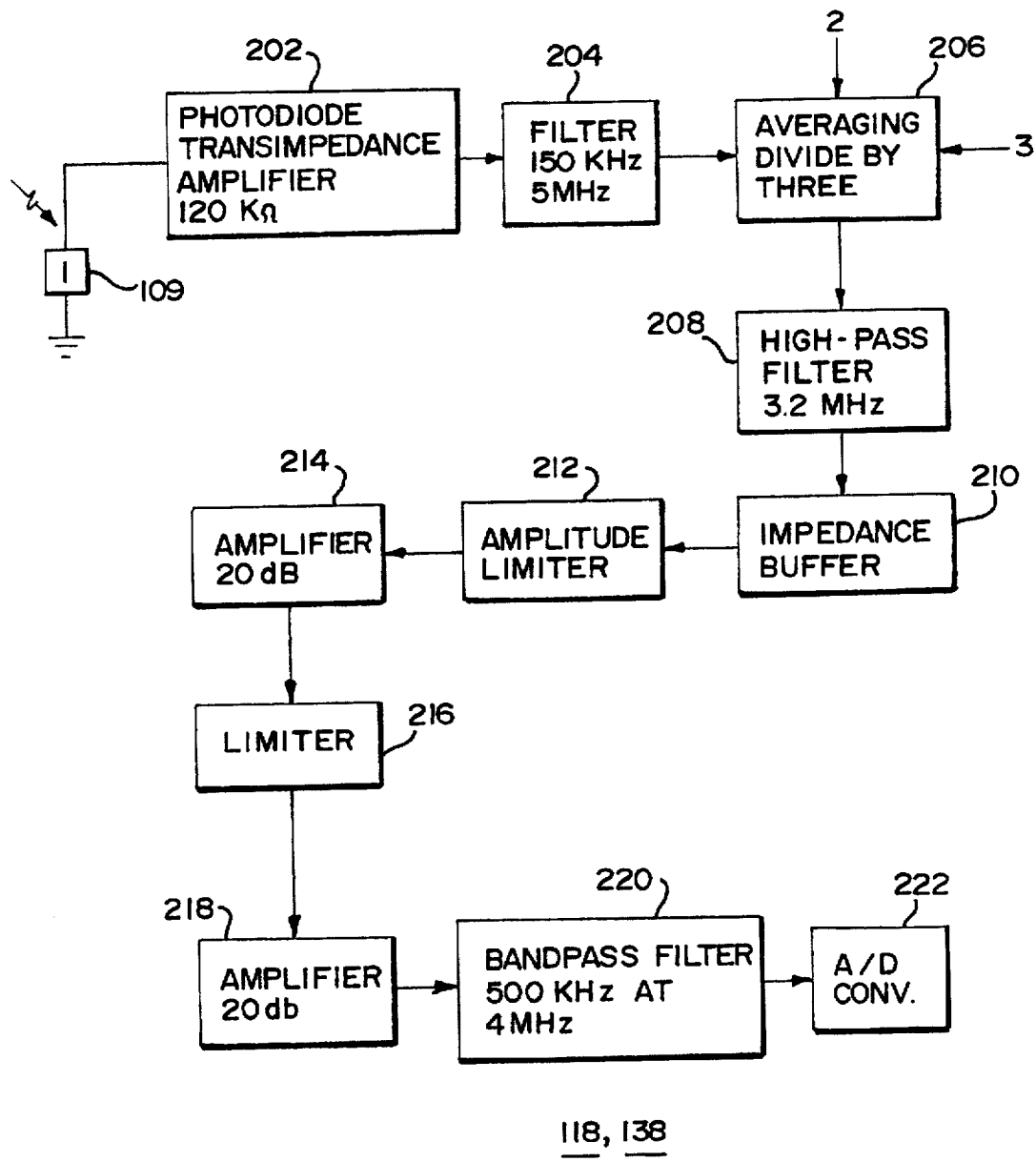
Figure 16:
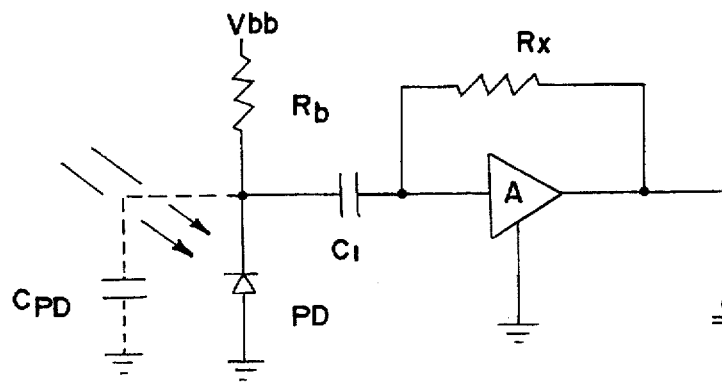
Figure 17:
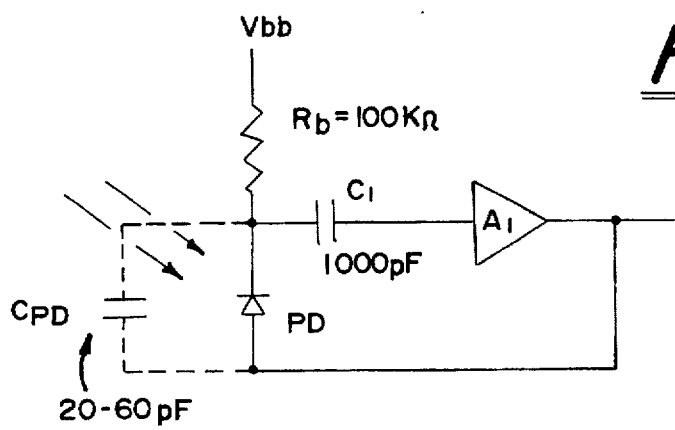
Figure 18:
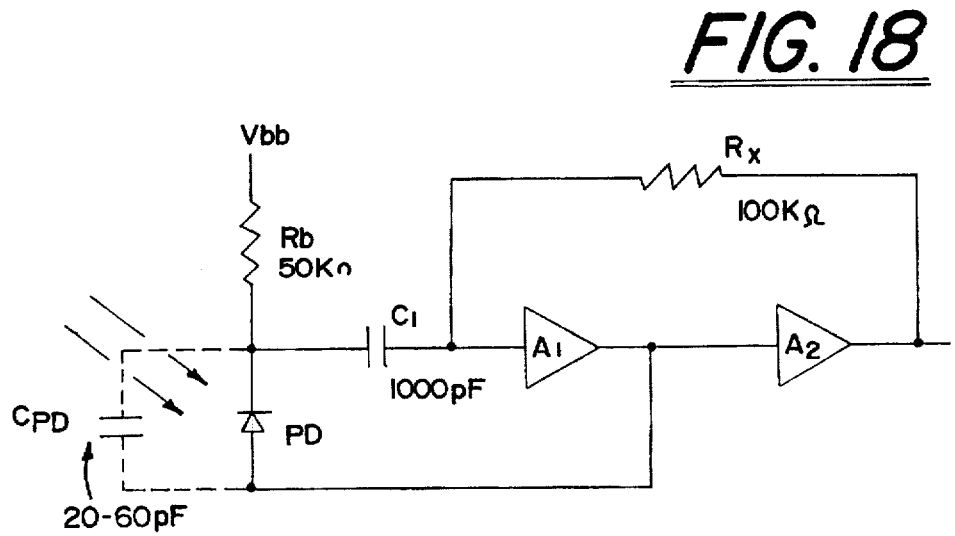
Figure 19:
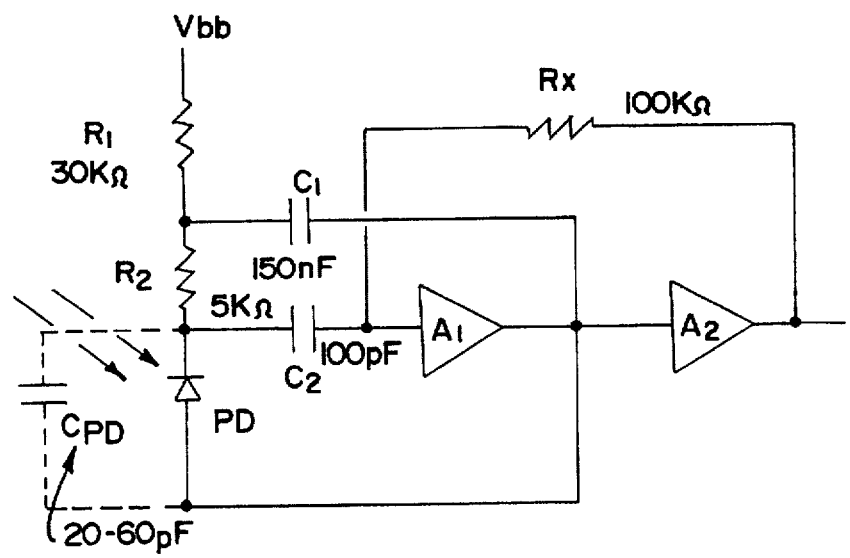
Figure 20:
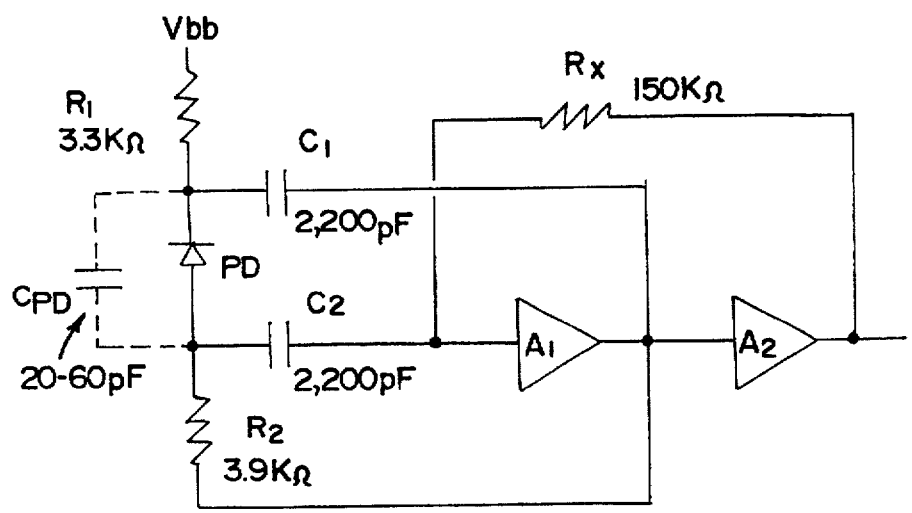
Figure 21:
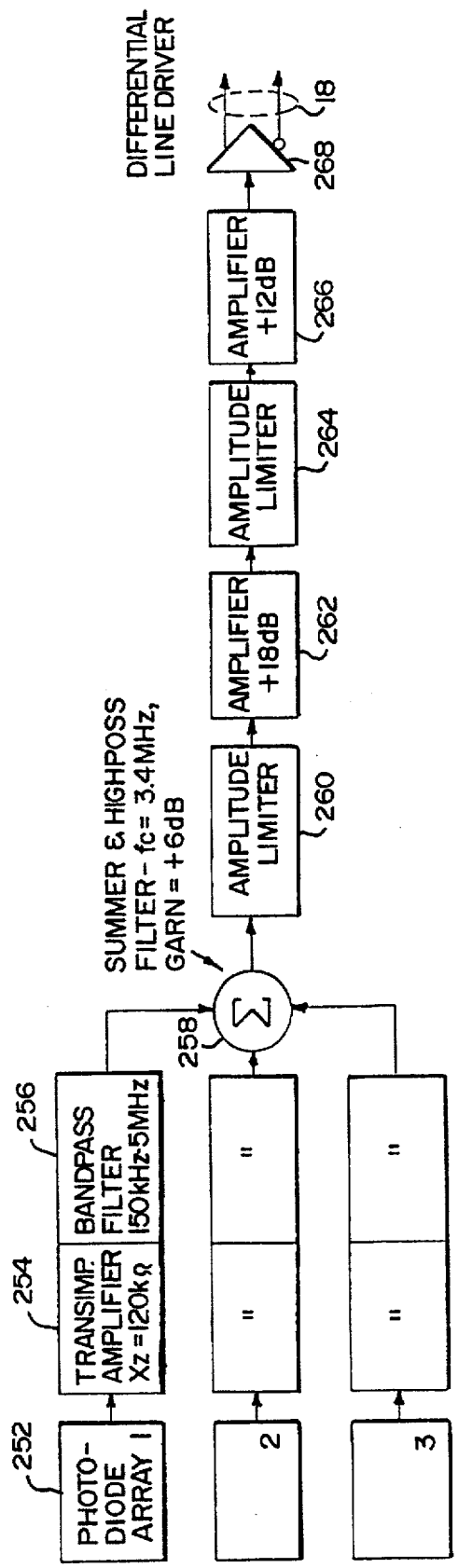

FIG. 7 is a timing cycle diagram similar to that of FIG. 6, wherein acknowledgement signals are returned to the remote stations after each data message;

FIG. 8 is a perspective view showing the general block diagram of the wireless data communication network of FIG. 1 in the context of use;

FIG. 9 is a detailed block diagram of one of the remote stations of the data communication network shown in FIG. 1;

FIG. 10 is a perspective top view of a transceiver section of the remote station of FIG. 9;

FIG. 11 is a perspective bottom view of a transceiver section of the remote station of FIG. 9;

FIG. 12 is a perspective side view of a photodiode module of the remote station of FIG. 9;

FIG. 13 is a detailed block diagram of the central station of the data communication network of FIG. 1;

FIG. 14 is a perspective top and side view of the stationary transceiver of FIG. 13;

FIG. 15 is a block diagram of IR signal processing occurring within FIG. 9;

FIG. 16 is a prior art photodiode transimpedance amplifier;

FIG. 17 is a floating photodiode amplifier of FIG. 15;

FIG. 18 is an alternate embodiment of the floating photodiode transimpedance amplifier of FIG. 17;

FIG. 19 is another alternate embodiment of the floating photodiode transimpedance amplifier of FIG. 17;

FIG. 20 is a third alternate embodiment of the floating photodiode transimpedance amplifier of FIG. 17; and FIG. 21 is a block diagram of IR signal processing occurring within FIG. 13.

DETAILED DESCRIPTION OF THE PREFERRED EMBODIMENTS

The solution to the problem of communication between a central station and a plurality of remote stations within an enclosed area, such as a hall or auditorium in a mobile context, without the problems associated with electromagnetic interference lies, conceptually, in the use of diffuse infrared signals. Infrared transceivers disposed within a transceiver section of a remote station and within an at least one stationary transceiving devices distributed around the periphery of the enclosed area and interconnected with the central station are used for the exchange of such signals. The remote stations and stationary transceiving devices are constructed to sense and detect infra-red (IR) signals received not only directly (line-of-sight), but also signals that may be reflected from the wall (or walls) of the enclosed area or from objects within the enclosed area.

Referring now to FIG. 1, a simplified general block diagram of a wireless multipoint data communications system 10 is shown. The system comprises a central station 12 and a number of remote stations 14. The central station 12 may be a stand-alone data processing and control entity or may be an access point (AP) used in conjunction with other data processors and systems over a larger hard-wired network.

Central station 12 communicates with remote stations 14 through optical infrared transceivers 16 coupled to the central station via a hard-wired link 18. While stationary transceiver 16 is shown in FIG. 1 as a single station, it is to be understood the transceiver 16 may actually (depending on a size of an enclosed volume of spaced in which the system 10 is used) be comprised of a number of transceivers distributed throughout a transmission space. For simplicity, infrared transceiver 16 will be described in terms of a single infrared transceiver station.

Each of the remote stations 14 includes an optical infrared transceiver which communicates with the central station by sending and receiving data messages over an infrared link 19. Depending upon the type of network, the central station may utilize the data messages itself, or route the data messages on to a different station in a local area network.

In the preferred embodiment, each of the remote stations is a portable, hand-held, battery-powered computer having an integrated infrared transceiver, as will be described in detail below. The remote stations may also include a keypad for data input, and a display for data output. Although the present invention is particularly adapted for two-way communication over a single-frequency infrared channel transmitting data packets in the half-duplex mode of operation, the present invention can also be used in a full duplex mode over multi-frequency channels. In the preferred embodiment, infrared link 19 has a 4 Megabit per second data rate using Return-To-Zero with Bit Insertion (RZBI) encoding scheme. However, the present invention is not limited for use with only wireless links or the particular type of channel or data communications scheme shown here.

Figure 2:
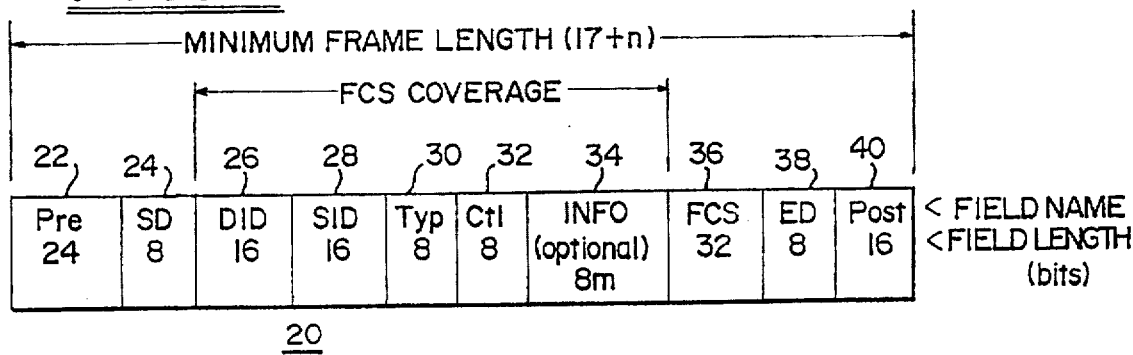
FIG. 2 is a pictorial representation of the channel frame format utilized in the multiple-access signalling protocol of the present invention.

FIG. 2 illustrates the specific channel frame format 20 used under the protocol for all information transfer and supervisory commands. The frame format of the invention basically follows the High-level Data Link Control (HDLC) data communication line protocol specification of the CCITT, or the Synchronous Data Link Control (SDLC) protocol specified by IBM. Hence, the published detailed specifications for the HDLC or SDLC protocols may be referred to for a further understanding of the common subject matter.

As shown in FIG. 2, each frame is subdivided into a number of individual fields, wherein each field is comprised of a number of 8-bit bytes. The following paragraphs describe channel frame format 20:

Preamble (PRE) 22: This field is a 3-byte field whose purpose is to provide a means of establishing bit synchronization of the receiver with the received signal including the clock recovery signal. The value of the preamble is typically chosen to have a high content of transitions (e.g., "FFFFFF" because in RZBI encoding each "1" bit provides a high-low transition).

Start Delimiter (SD) 24: The purpose of the SD frame is to provide byte synchronization within the receiver. The 8 contiguous bits of the pattern provide a clear indication of the boundary between the "1" bits of the PRE and the bits of the SD. It is a unique "illegal" data structure because the bit insertion of the modulation scheme prevents this number of contiguous zero bits from occurring within the data (anyplace between the SD and ED fields).

Destination Identifier (DID) 26: This field contains the 2-byte address of the station to which the frame is being sent. In other words, in a polling frame, the DID field of a frame transmitted to a remote station first identifies the particular remote station being polled by the central station and then the DID field of a return frame identifies the central station as the destination for the data message being returned by the remote station. Each of the stations is assigned a unique identification code, or address. The remote stations typically receive a new DID address each time the remote station registers with the network 10. However, a dynamic address determination procedure could also be used where the DID address changes during a data exchange under some need-based algorithm. In the preferred embodiment, the addresses of remote stations (non-controller stations) begin with 0000 hex and increase to a maximum amount determined by the number of remote stations allowed in the network (e.g., 7FFF hexadecimal). Controller stations (e.g., central station 12) may be assigned other numerical values (e.g., 8000-EEED hexadecimal). A value of FFFF hex in this field denotes a broadcast frame, which would be received by all stations.

Source Identifier (SID) 28: This field is the 2-byte address of the station sending the frame. To ensure the integrity of the data being transmitted, both the destination and source addresses are included within each frame.

Type Field (TYP) 30: The 1-byte field indicates to the receiver how to interpret a frame's content and in effect provides a control function. A summary of the possible types of frames are as follows: RSYNC, MRSYNC, RegRTS, RTS, FORF, DSYNC, EDSYNC, RegCTS, CTS, DATA, MDATA, and ACK. The meaning and content of the types of frames listed may be best understood by reference to FIGS. 4A–C. The use of the frames may be best understood by reference to subsequent sections.

Control Flags (CTL) 32: This is a 1-byte control field containing bit-mapped flags, primarily used for supervising commands. In the preferred embodiment, control field 32 includes priority flags and retransmission flags, which will be described below.

Information (INFO) 34: This is a variable length field used for transferring data. The INFO field 34 is also used in conjunction with certain types of frames (e.g., RSYNC, MRSYNC, DYSNC, and EDSYNC) as a repository for an indicia of epoch location (e.g., the location of upward data transfer period (upward period), broadcast period, and downward data transfer period (downward period) within the overall data exchange period (data period)).

Frame Check Sequence (FCS) 36: This 4-byte field is used to detect bit errors which may occur during transmission. In the present embodiment, a 32-bit cyclic redundancy check (CRC) algorithm is used to detect errors in fields 26, 28, 30, 32, and 34.

End Delimiter (ED) 38 and Postamble (Post) 40: The purpose of the ED 38 is to allow the receiver to detect an end of frame. The purpose of the POST 40 is to prevent the receiver from mistaking an ED/POST combination for an SD/DID combination in that the hexadecimal value of 0EEEE would be an invalid DID.

FIG. 3 illustrates a repeating frame structure (superframe) used by the system 10 to exchange information between the central station 12 and the remote station 14. Each frame making up the superframe has the frame format described above.

Superframes are not always of the same temporal length. The superframe, in turn, may be divided into a variable length period used for receipt of access requests (request period) 50 and a variable length field used for data exchanges (data period) 51.

The central station 12 identifies the beginning of the superframe to the remote stations 14 by transmission of a request synchronization (RSYNC) frame or a mandatory request synchronization (MRSYNC) frame 52. (The RSYNC frame requires only those remote stations 14 desiring access to respond while the MRSYNC requires all remote stations 14 to respond.) The remote stations 14 identify the RSYNC or MRSYNC frames by reference to the type field of the frame (FIGS. 4A–C). In addition to identifying the beginning of the superframe, the RSYNC or MRSYNC frame 52 provides information within the INFO field 34 (FIG. 4A) relative to the number and type of slots (slots using a non-contention based access protocol or a contention based access protocol) within the request period 50. The slot information is used by the remote stations to facilitate system access (to be explained later) or to power-down during the request period 50 if the remote station 14 does not need access to the network 10.

Following the request period 50, the network 10 enters a data period 51. The central station 12 identifies the beginning of the data period 51 to the remote station 14 by transmission of a data descriptor frame 53 (e.g., a data synchronization (DSYNC) or extended data synchronization (EDSYNC) frame). Contained within the INFO field 34 (FIG. 4A) of the DSYNC or EDSYNC frame 53 is temporal information relative to the length of each subsection of the data period 51. The temporal information, as above, is used by the remote stations 14 to reduce a duty cycle of activation by powering-down during appropriate portions of the data period 51.

In accordance with an embodiment of the invention, the slots of the request period are divided into two groups where a first group of slots allows for random access under a contention based protocol (contention slots) and a second group of slots allows for access under a non-contention protocol (reserved slots) (e.g., under an implied polling protocol). Under the invention, the number of contention slots may be constant or may vary based upon an estimate of the number of unregistered remote stations within the service coverage area of the network 10. The number of reserved slots, on the other hand, is adjusted based upon loading. When a remote station 14 is first activated the remote station 14 is granted access to the network 10 under a two-step process. First the remote station 14 transmits an access request within a contention slot. The central station 12, upon receipt of the access request within the contention slot then, as a second step, assigns the remote station 14 to a non-contention slot before finally granting access.

The remote station 14 first monitors for a RSYNC or MRSYNC frame 52. Since the remote station 14 does not yet have a reserved slot, the remote station 14 must access the network 10 through a contention slot. The remote station 14 identifies contention slots by examining the contents of the INFO field 34 of the RSYNC or MRSYNC frame 52. Contained inter alia within the INFO field 34 of the RSYNC or MRSYNC frame (FIG. 4A) is the total number of slots in the request period and the total number of reserved slots. By knowing the location of the reserved and contention slots relative to the RSYNC or MRSYNC frame (e.g., the non-contention slots may immediately follow the RSYNC or MRSYNC frame), the remote station 14 can determine the location of the contention slots. Access may then be secured through a randomly selected contention slot.

By way of example, FIG. 5 depicts a request period having 10 slots. If the reserved slots were designated as being slots 1–7, then slots 8–10 would be the contention slots. An INFO field 34 of an RSYNC or MRSYNC frame 52 in such a case would indicate a total slot number of 10 and a total reserved slot number of 7. Using known methods, the remote station would then randomly generate a number in the range of 1 to 3 and add the randomly selected number to 7 for a final determination of the contention slot to be used in requesting access.

In requesting access to the network 10, the remote station 14 sends a registration request to send (RegRTS) frame (FIG. 4B) within the selected contention slot. The INFO field 34 of the RegRTS frame contains a 48 bit address of the requesting remote station 14 along with coding within the type field that the frame is a RegRTS frame.

Upon receipt of the RegRTS from the remote station 14 by the central station 12, the central station 12 verifies by reference to a memory (not shown) that the address of the remote station 14 is one that is authorized to access the network 10 and that the remote station 14 has a software version compatible with the network 10. Upon verifying that the remote station 14 is an authorized user and is compatible with the network 10, the central station 12 issues a local identifier in favor of the remote station 14. The central station 12, on the other hand, does not immediately transmit the local identification to the remote station. Under the invention the central station waits until the next downward portion of the data period 51 before transmitting the identifier to the requesting remote station 14.

Contained within the local identifier is an identifier of a reserved slot of the request period 50 allocated for use by the remote station 14. The central station 12 may create a reserved slot for the remote station 14 by expanding the length of the request period to 11 slots or may assign the remote station 14 to an unoccupied slot of reserved slots 1-7 (FIG. 5).

Likewise, the central station 12 may de-allocate a slot previously reserved for use by other remote stations 14 based on certain operating parameters. The central station 12 may deallocate slots for instance where the time since the last use of the slot exceeds some threshold value or if the remote station 14 does not respond to a known number of consecutive MRSYNC frames.

During the next downward period of the data period 51 the central station 12 transmits the local identifier to the remote station 14 through use of a registration clear to send (RegCTS) frame (FIG. 4B). Upon receiving the RegCTS, the remote station retrieves the local identifier and, using the retrieved local identifier, may transmit a Request to Send (RTS) within the designated reserved slot under an implicit polling format during the request period 50 of the next superframe.

Under an alternate embodiment, the remote station 14, upon receipt of a RegCTS may immediately respond by transmitting data. Alternately, a central station 12 may transmit a RegCTS at any time to fill "holes" in the request period (e.g., when a remote station 14 is deactivated or leaves the service coverage area of the network 10).

In general, implicit polling is performed during the request period 50, and explicit polling—of only those remote stations which requested access to the channel—is performed during the data period 51.

To initiate the superframe, the central station broadcasts an RSYNC or MRSYNC frame 52 to all the remote stations. The RSYNC or MRSYNC frame is issued periodically, and it defines the start of a number of time slots of the request period. In the preferred embodiment, the central station sends an RSYNC or MRSYNC frame at least once every second. If there is less data to exchange then the superframe would occur more often, but not more often than once every 100 ms. If there were less data than could be transferred within the 100 ms interval, then the communication channel would be idle for a portion of the 100 ms.

Under an alternate embodiment, an RTS of the remote station 14 specifies the number of data frames it wants to send during the superframe. It is then up to the central station 12 to determine how many times a remote station 14 gets polled. For instance, a central station 12 wouldn't let an entire superframe be "eaten up" by a single station if it requests to be polled too often. Once a request period 50 is complete, the central station 12 has a picture of all upward and downward data periods, and it will divide up the superframe equitably.

A central station 12 may indicate within the RTS frame during the RTS/CTS/DATA/ACK sequence how many frames it will send to the remote station 14 during a superframe. During a DATA/ACK sequence, the use of a "more" bit indicates to the remote station 14 that there is more data to be transmitted during the superframe.

Every remote station has a preassigned waiting period that will begin upon the reception of the RSYNC or MRSYNC frame. These waiting periods are illustrated as time slots TS in FIG. 6, which fill up the remainder of the request period 50.

Since remote station 1 has been assigned the first time slot, it issues a reserved slot request RR frame 54 if it has data to transmit on the channel. Hence, the first time slot has been replaced with the reserved slot request frame $RR_1$ (RTS frame) transmitted from remote station 1. As seen in the example of FIG. 6, no reserved slot request frame was issued in time slot 2 (frame 55), and a reserved slot request frame $RR_3$ was issued from remote station 3 in time slot 3 (frame 56). In the example shown, a maximum number $X-X_c$ (where X is total slots and $X_c$ is contention slots) denotes the number of active remote stations in the network, and, accordingly, the number of preassigned time slots. (See frame 56.) Note that, in this example, the absence of a reserved slot request frame in a time slot represents a negative access request signal to the central station 12. As will be seen below, an alternate embodiment of the protocol always returns either a positive or negative access request signal to the central station upon issuance of an MRSYNC frame.

After every station has been given a chance to make a reservation, the central station will switch to a modified explicit polling mode, wherein it will sequentially issue a CTS frame to every remote station 14 that made a reservation.

Before the central station 12 begins the explicit polling, on the other hand, the central station 12 must describe the data period 50 for the benefit of those remote stations 14 that may wish to power-down for portions of the data period 50. The central station 12 describes the data period 50 to the remote stations 14 by transmitting a DSYNC or EDSYNC frame 53. (The DSYNC and EDSYNC frames differ primarily in the amount of information provided. In general, the EDSYNC allows for a lower duty cycle of remote stations 14.)

If either a DSYNC or an EDSYNC frame 53 is used, then the reader will find via reference to FIG. 4A that the length of the polling period for the upward transmission of data is to be found within the INFO field 34 of the DSYNC or EDSYNC frame 53. A remote station not needing to transfer data to the central station 12 may use the time period specified to deactivate its transmitter and receiver until a point just before the broadcast period, where the remote station 14 must again re-activate its receiver for the receipt of system information during the broadcast period.

As illustrated in FIG. 6, the central station polls the first remote station during frame 60 of the upward period with CTS frame $P_1$, since remote station 1 sent its reserved slot request frame $RR_1$ during frame 54. Immediately upon receiving the poll signal addressed to remote station 1, that station responds with its data packet $DATA_1$ during frame 62. The central station then checks its poll list to determine which remote station is to be polled next. In the example shown, remote station 3 is polled via poll frame $P_3$ during frame 64, and it responds with its data packet $DATA_3$ during frame 66. The polling ends upon the completion of the response of the last station on the list, which, in this case, was remote station 3.

Priority message capability is also provided for in the reservation-based polling and data exchange protocol of the present invention. Recall that the control field 32 of the channel frame format 20 (FIG. 2) includes a number of bit-mapped priority flags. In the preferred embodiment, four levels of priority can be implemented using two priority flag bits. If any remote station had a priority message to send, then that station would set its priority flags to the appropriate priority level, and transmit a reserved slot request RR frame to the central station in its preassigned time slot during the reserved slot request period. Upon receipt of this reserved slot request frame containing priority information, the central station would rearrange the poll list into priority-level order. Accordingly, the central station would poll the remote stations in priority-level order.

The timing cycle diagram shown in FIG. 6 can be used to illustrate the reservation-based polling protocol with priority-level polling. Assume that the time slots $TS_1$, $TS_2$, $TS_3$, (frames 54-56) of the reserved slot request period are sequentially assigned to correspond with three remote stations 1-3. If all three remote stations had non-priority messages to send, then each would send its reserved slot request RR frame during the appropriate time slot, and the central station would poll each remote station in numerical order, i.e., the poll list would appear as: $P_1$, $P_2$, $P_3$. If, however, remote station 3 had a level-one priority message to send, and remote station 2 had a level-two priority message to send, then these stations would indicate such using the priority flags in the control fields of their reserved slot request frames. The central station would then reorder its poll list to appear as: $P_3$, $P_2$, $P_1$. Thus, the remote stations are polled in priority-level order. Numerous other multiple-level priority message schemes can be used with the present invention, a few of which will be described below.

FIG. 7 represents a similar timing cycle diagram to that of FIG. 6, with the addition that an acknowledgement (ACK) frame is transmitted from the central station to the remote station after the reception of each data message from the remote station. In order to send an ACK frame, the central station 12 must, first, correctly receive the data message.

The example of FIG. 7 illustrates that, during the reservation request period, remote stations 1 and 3 have transmitted reserved slot request frames 54 and 56, respectively. Therefore, during the upward data transfer period, each of these two remote stations is polled. As before, a first poll frame $P_1$ is issued from the central station in frame 60, and data packet $DATA_1$ from remote station 1 is returned during frame 62. However, now an acknowledgement frame $AK_1$ is sent from the central station to remote station 1 during frame 63. A similar polling/data transfer/acknowledgement sequence occurs for remote station 3 during frames 64, 66, and 67. As only partially shown in FIG. 7, remote station $X-X_c$ was polled, it transmitted its data packet, and its acknowledgment frame $AK_x$ is shown being returned during frame 69.

If the remote station 14 does not receive an acknowledgement (ACK) from the central station 12 following a data transfer (or does not get polled), then the remote station 14 sends a reserved slot request (RR) during the next request period 50. If the remote station 14 does not get a response after 3 tries, the remote station may try again later or discard the data.

The broadcast period follows the upward period. Any stations which may have de-activated during the upward period must re-activate for the broadcast period. During the broadcast period, data is broadcast from the central station 12 to all remote stations 14. Data frames (FIG. 4C) during the broadcast period are sent with the broadcast DID (i.e., FFFF hexadecimal). Broadcast data frames are not preceded by an RTS/CTS exchange and are not acknowledged by receiving remote stations 14. If there is no broadcast data to be sent from the central station 12 to the remote stations 14, then an EDSYNC frame 53 at the beginning of the data period 51 may be used to indicate a broadcast length of zero.

Following the broadcast period is the downward data period. If the data descriptor 53 at the beginning of the data period 51 were a DSYNC frame, then all remote stations 14 must remain activated during the downward data period.

If, on the other hand, the data descriptor 53 were an EDSYNC frame, then the contents of the EDSYNC would provide advance notification of which remote station(s) 14 would receive data and, therefore, which remote stations 14 would remain activated during the downward data period. Other remote stations 14 not present within the list of the EDSYNC frame may deactivate for the duration of the downward data period.

Data transfer from the central station 12 to the remote stations 14 during the downward period may occur under either of two possible scenarios. The central station may either transmit an RTS and wait for a CTS before transmitting the data, or may simply transmit a data frame and wait for an acknowledgement response. The use of the RTS by the central station 12 avoids the unnecessary transmission of data when the remote station 14 may not be within range of the central station 12. The use of the RTS/CTS exchange, on the other hand, causes more overall data traffic between the central station 12 and remote station 14.

If the remote station received an erroneous data message, then a negative acknowledgment frame would be returned to the central station. If the central station received neither an acknowledgement frame nor a negative acknowledgement frame from the remote station, then the central station would retransmit the same data message in the next superframe.

Where the RTS/CTS/DATA/ACK sequence is used and there is no response to the RTS, or if the CTS is received with errors, or if after the RTS/CTS/DATA sequence, the ACK isn't received, or if the ACK is received with errors, then the central station 12 begins its retransmission with the retry bit of the RTS frame set. On the other hand, where the DATA/ACK sequence is used and there is no ACK received, or if the ACK is received with errors, then the central station begins its retransmission with the retry bit of the DATA frame set.

Depending upon the requirements of the particular data communication system, it may be advantageous for the central station to track and report on the number of active remote stations in the network—whether or not each remote station has a data message to send. For this purpose, the central controller would issue a mandatory request synchronization (MRSYNC) frame to all of the remote stations. When a remote station receives this frame, it responds with an RTS frame if it has data to send, or it responds with a forfeit (FORF) frame if it does not. If a particular remote station does not respond to the global reservation sync frame, then the central station assumes that the particular remote station 14 is not presently active. In this manner, all of the active remote stations will be accounted for by the system without affecting the throughput of the data communication channel.

Periodically, the central station issues a frame (RSYNC, MRSYNC, DSYNC, or EDSYNC) including a superframe number. The superframe number may be used by the remote stations 14 as a functional check of proper operation (e.g., that a particular sleep mode interval did not cause a remote station 14 to miss part of a superframe).

Shown in FIG. 8 is a perspective view of a wireless multipoint data communication system 10, in a context of use within an enclosed area 11 such as a hall or auditorium. As shown in FIG. 8, communicated signals 19 between a remote station 14 may be transceived along a direct path 13 or an indirect path 15 where a transmitted signal is reflected from a wall or walls of the enclosed area before being received by the remote station 14 or stationary tranceiver (e.g., stationary transceiver 16a).

Referring now to FIG. 9, a detailed block diagram of one of the remote stations 14 is shown. As described above, each remote station 14 includes a transceiver section 104 which communicates with the central station 12 via an optical-infrared data link 19 and with a data processing section 102 via an RS232 interconnect 103. The heart of the transceiver section 104 of the remote station 14 is a communication processor 114 operating at 32 Mhz. Remote controller 110 interfaces with a data processor 112 and the communication processor 114, such that data processor 112 can communicate over the infrared link using the polling protocol described above. In a preferred embodiment, data processing section 102 may be part of an EPSON Model No. H1001BEW hand-held (palmtop) computer.

Communication processor 114 of the transceiver section 104 may be a Field Programmable Gate Array (FPGA) with custom programmed logic provided by Spectrix Corp., of Evanston Ill. (see Appendix I). Communication processor 114, in turn, controls an infrared transmitter 116 and an infrared receiver 118.

Also shown in FIG. 9 is a infrared filter cover 101 that surrounds and protects the transceiver section 104 of the remote station 14. In addition to offering physical protection, the cover 101 functions to increase the sensitivity of the IR receivers 118 by blocking undesired wavelengths (e.g., visible light to U.V.) from a received signal. The cover is constructed of a polycarbonate (e.g., Lexan™ such as that sold by General Electric under part number 141) with a light absorbing material (e.g., a dye such as that sold by General Electric under part number 701055) disposed throughout the material of the cover 101.

A top perspective view of the transceiver section 104 is shown in FIG. 10 with the protective cover 101 removed. Shown in the top perspective view (FIG. 10) of the transceiver section 104 is a phantom view of the communication processor 114 in communication with the IR transmitter 116. The IR transmitter 116 is comprised of IR drivers 107 and IR light emitting diodes (LEDs) 105.

FIG. 10 shows a set of 12 IR transmitters 105 arranged in a semi-circle along the top edge of the transceiver section 104, in 15 degree increments. The 12 IR transmitters may be any commercially available light emitting diode (LED) having a high power output and a broad frequency response (e.g., a model number DN304 available from Stanley). The 12 IR transmitters 105 provide a means of transmitting communicated information directly (line-of-sight) to stationary transceiving devices 16a, 16b or indirectly via reflections from the walls of enclosure 11. Under an embodiment of the invention, the IR transmitters 105 transmit information simultaneously to provide a diffuse transmission of communicated information from remote station 14 to stationary transceiver devices 16a, 16b.

FIG. 11 is a bottom view of the transceiver module 104 of remote station 14. Mounted along an outside edge of a baffle of the transceiver module 104, in opposing relation to the palmtop computer 102 is a set of 3 IR photodiode receiving modules 109 (shown in greater detail in FIG. 12). Each module 109 of the transceiver module 104 is disposed in a 53 degree relation to adjacent modules 109 of the transceiver module 104. Arranging the modules 109 in 53 degree relation enhances the ability of the transceiver module 104 to receive and detect diffuse IR radiation anywhere within a 180 degree field of view (90 degrees either side of a longitudinal axis of the remote station 14).

To further enhance the field of view of the transceiver module 104, each photodiode 111 of each receiving module 109 is tilted on the module 109 by some enhanced receiving angle "a" (e.g., 11 degrees). The 6 IR receivers 111 may be any commercially available photodiode having a large photo-active area and a broad frequency range (e.g., a model number VTP1150 from EGG Vactec).

To further improve a signal to noise ratio it has been determined that an unexpected improvement of performance of the photodiodes 111 may be achieved by providing an electromagnetic shield 113 around the photodiodes 111. The electromagnetic shield 113 is a commercially available expanded metal copper structure having holes substantially 2.00 mm in diameter.

FIG. 13 is a detailed block diagram of central station 12 of the data communication network shown in FIG. 1. In order to communicate with the remote stations 14, the central station includes a number of external transceivers 16 (for simplicity, only one is shown in FIG. 13). In the preferred embodiment, infrared transceiver 16 is located at a distance from central station 12, since a personal computer is used for the network controller and since the infrared link is limited to the confines of the enclosed area 11. A network controller 130 interfaces an input/output port 132 to a communication processor 134 such that the reservation-based polling protocol of the present invention is used to transmit and receive data from infrared link 19 to I/O port 132 via infrared transmitter 136, infrared receiver 138, and hard-wired link 18. In the preferred embodiment, the function of network controller 130 is performed by an IBM-compatible personal computer using a DOS-based operating system. The personal computer typically includes a memory 140, a clock 142, a display 144, and a keyboard 146.

Under an embodiment of the invention where multiple stationary transceivers 16 are used, the communication processor 134 (FIG. 13) is equipped with a signal measuring device 137. The network controller 130, through the communication processor 134, measures an infrared signal strength (either diffuse or line-of-sight) of each transmitting remote station 14 at each stationary transceiver 16 and selects the stationary transceiver providing the strongest signal measurement. Alternatively, the network controller 130 may select a stationary transceiver 16a, 16b based upon a bit error rate (BER). If a BER is used, the network controller may measure the BER by comparing known sequences (e.g., DID) received from a remote station 14 by each stationary transceiver 16 and selecting the stationary transceiver 16 providing the fewest errors.

Stationary transceivers 16 are each attached to a wall of the enclosed area 11 and protected by a hemispherically shaped cover 139. The cover 139 not only protects the stationary transceiver 16 from damage and contamination, but also serves as a radiation filter by blocking radiation outside the infrared spectrum (e.g., visible light to U.V.). Under an embodiment of the invention, the cover 139 is fabricated of an acrylic (e.g., Plexiglas™ supplied by Autobass of Bristol, Pa. under catalog number 2711—UV Visible Blockout).

FIG. 14 is a perspective view of a stationary transceiver 16 as it would appear mounted to a wall of the enclosed area 11 with the cover 139 removed. For purposes of detecting diffuse infrared signals, at least four of the photodetectors 135 of the stationary transceiver 16 are tilted 45 degrees to either side of a vertical plane 131 orthogonal to the wall of the enclosed area 11. Four other photodetectors 135 are oriented parallel with the plane 131. The photodetectors 135 may be any commercially available photodiode having a large photo-active area and a broad frequency response (e.g., a model number VTP1150 available from EGG Vactec). As with the remote stations 14 the photodiodes 135 are provided with an electromagnetic shield 141 comprised of expanded metal.

The transmitting LEDs 133 of FIG. 14 occupy a similar relationship with respect to the vertical plane 131. The LEDs 133 may be any of a number of commercially available LEDs having a high power output and a broad frequency response (e.g., a model number DN304 available from Stanley).

Photodiodes 135 and LEDs 133 each have an active receiving/transmitting arc of approximately 90 and 40 degrees, respectively. The active spans of each device, plus the tilting of devices by 45 degrees relative to the wall of the enclosed area 11, allows each stationary transceiver 16 to be able to transceive signals omnidirectionally, from substantially any angle passing through the hemisphere defined by the filter cover 139.

Shown in FIG. 15 is a signal processing block diagram for the infrared detector 118 of the remote stations 14. FIG. 21 shows a corresponding signal processing block diagram for the receiver 138 of the stationary transceiver 16. The processing steps used within the receiver 118 and the receiver 138 are functionally equivalent. Explanation of the processing steps will be offered in terms of the receiver 118 with differences related to receiver 138 noted in passing.

Where the term "photodiode" is used in FIG. 15, or "photodiode array" of FIG. 21, it is understood that the term may refer to a number of photodiodes connected in parallel. For example, in FIGS. 11 and 12 reference number 109 is used to refer to a pair of photodiodes connected in parallel. Likewise, in FIG. 14 the four photodiodes arranged in parallel relationship to the vertical axis 131 may be connected in parallel.

The block diagram (FIG. 15) shows signal processing within blocks 202 and 204 for one of 3 photodiodes. Signal processing of the other two photodiodes (inputs 2 and 3 of block 206) are assumed to be the same. Likewise, signal processing within corresponding blocks 254, 256 of FIG. 21 for photodiode array #1 of the stationary transceiver 16 is the same for each of 3 photodiode arrays.

Where the remote station 14 averages the input of the 3 photodiodes within an averaging block 206, the receiver 138 of the stationary transceiver 16 simply adds the inputs of the 3 photodiodes in summer 258. Also, the function of averaging and filtering blocks 206 and 208 of FIG. 15 are shown combined in the summer block 258 of FIG. 21. The receiver 138 also includes a differential line driver 268 which transfers the amplified limited signal through wireline 18 to the communication processor 134 for bandpass filtering and analog to digital conversion.

Referring now to FIG. 15, an infrared signal 19 received by the photodiode 109 is converted from a current signal to a voltage signal within a transimpedance amplifier 202. The voltage signal is bandpass filtered within the filter 204 having 3 dB points at 150 kHz and 5 MHz. Signals from the three photodiodes 1–3 are averaged within an averager 206 by summing and dividing by 3. Low frequency noise is removed by high pass filtering in a high pass filter 208.

After high pass filtering the signal is impedance buffered within a buffer 210 and amplitude limited within limiter 212. The signal is amplified by 20 dB in amplifier 214 and limited again in limiter 216. The signal is then amplified by 20 dB in another amplifier 218 and bandpass filtered in a filter 220 having a center frequency at 4 MHz and a bandwidth of 300–500 kHz. Following the final filtering in filter 220, the signal is converted to the serially transmitted, digital format described above within an analog to digital (A/D) converter 222.

Conversion of the photodiode signal of diodes 1–3 from a current signal into a voltage signal within the transimpedance amplifier 202 may occur under any of a number of conversion methods and through any number of different types of detecting circuits. FIG. 16, in fact, is an example of a prior art detecting circuit. FIG. 16 shows a photodetector PD providing an input to transimpedance amplifier A through coupling capacitor $C_1$. The photodiode PD receives a supply signal $V_{bb}$ through supply resistor $R_b$. Equivalent capacitor $C_{PD}$ (shown in phantom) represents the capacitance of the photodiode PD.

The transimpedance amplifier A is a high gain, inverting amplifier. The transimpedance amplifier A has a feedback resistor $R_x$. The input impedance $Z_{in}$ of transimpedance amplifier A and feedback resistor $R_x$, to a first approximation, equals R/(1+voltage gain of A).

The positive voltage source $V_{bb}$ applies a voltage across the photodiode PD through supply resistor $R_b$ which reverse biases the photodiode junction, causing the photodiode PD to operate in the photoconductive mode. Current passes from the source $V_{bb}$ to ground through a circuit that includes the supply resistor $R_b$ and photodiode PD. When the photodiode PD is subjected to a modulated light source of the correct wavelength, the photodiode PD modulates the current passing through the circuit from the source $V_{bb}$ to ground. The modulated current through the photodiode, in turn, causes a modulated current to be coupled through $C_1$ into the transimpedance amplifier A.

The capacitor $C_1$ acts to couple the modulated current to the input of A while blocking slow and/or large variations in voltage caused by photocurrent changes resulting from changes in ambient (non-signalling) light levels. At signalling frequencies, the reactance of $C_1$ is small compared to the effective input impedance $Z_{in}$ of the transimpedance amplifier $A_1$.

Since the supply resistor $R_b$ is relatively large compared to the imput impedance $Z_{in}$ of the transimpedance amplifier A, the supply resistor $R_b$ represents a minor, parasitic shunt path for signal current. Most of the signal current is sunk by the virtual ground formed at the input of A, represented by the input impedance $Z_{in}$.

The output of the transimpedance amplifier A is a modulated voltage which is an analog of the optical stimulus of the photodiode PD. The amplitude of the output voltage is ideally $R_x$ times the current of the photodiode PD.

The dominant limitation on the bandwidth of the prior art circuit shown in FIG. 16 lies in the resistor-capacitor (RC) time constant inherent in the combination of $C_{PD}$ (the parasitic photodiode depletion layer capacitance) and the effective input impedance $Z_{in}$ of the transimpedance amplifier A. Obtaining adequate bandwidth for the circuit of FIG. 16, when $C_{PD}$ is large, requires an amplifier A with a very high gain at the required bandwidth (this is costly), or a small $R_x$ (this reduces the transimpedance gain).

A large $C_{PD}$ associated with large photo-active areas of photodiodes, together with the value of $R_x$, exacerbates noise characteristics of the transimpedance amplifier circuit of FIG. 6.

The prior art circuit of FIG. 16 is also subject to other limitations which make the circuit of FIG. 16 not appropriate for the system 10 of the present invention. If the circuit of FIG. 16 is subjected to a strong optical source, the photodiode PD can pass a comparatively high current, resulting in the coupling capacitor $C_1$ rapidly attaining an abnormal charge condition (in the sense that it exceeds normal operating parameters for this circuit). The photodiode PD sinks current from the left side of $C_1$ while the resistor $R_x$, connected to the output of the transimpedance amplifier A, sources current to the right side of $C_1$. When the strong stimulus is removed, the only viable discharge path for restoring normal operating voltages to $C_1$ is through the supply resistor $R_b$. Since the supply resistor $R_b$ is relatively large, the long time constant associated with $C_1$ and $R_b$ results in the circuit of FIG. 16 having a very slow recovery time, unacceptable for a high throughput system.

To avoid the problems associated with prior art photodetection circuits under an embodiment of the invention, a floating photodiode amplifier system (FIG. 17) is used as a diffuse infrared signal detector. Amplifier $A_1$ is a non-inverting amplifier having a gain of slightly less than unity and a bandwidth of at least 12 MHz. In the floating photodiode amplifier system of FIG. 17, the anode of the photodiode PD of the receiver 118, 138 is returned to the output of transimpedance amplifier $A_1$. The photodiode PD is reverse biased as in the previous example except that now its anode side is returned, not to a real ground, but to an artificial ground represented by the the low impedance output of the amplifier $A_1$. The gain of $A_1$ is chosen to have a value very near, but not exceeding, unity.

The input impedance of the amplifier $A_1$ of FIG. 17 is chosen to be very high (e.g., >200 k$\Omega$). Because of the high input impedance, a modulated photocurrent passing through the photodiode must also pass predominently through $R_b$ generating, in turn, a modulated signal voltage across $R_b$. Since the voltage source $V_{bb}$ is fixed relative to ground and since one side of the supply resistor $R_b$ is fixed at the supply source $V_{bb}$, it is clear that the modulated signal voltage may be detected at the cathode of the photodiode PD with respect to ground. Capacitor $C_1$ couples the signal voltage to the input of $A_1$. An essentially identical copy of the signal appears at the output of the amplifier $A_1$. Since the anode of phototransistor PD is connected to the output of the amplifier $A_1$, it can be observed that virtually no signal voltage appears across the photodiode PD. With no signal voltage across the photodiode PD, the bandwidth limitation that would otherwise result from the interaction of $R_b$ and $C_{PD}$ does not exist. The signal voltage appearing at the output of the amplifier $A_1$ has an ideal amplitude of $R_b$ times the photodiode current.

While the substantially passive transimpedance gain mechanism of the circuit of FIG. 17 is practical for large photodiode/low speed systems, or for small photodiode/ moderate speed systems, a high bandwidth photodetector amplifying circuit, with adequate transimpedance gain, may prove difficult to construct with the circuit of FIG. 17. Such a circuit may be difficult because the bandwidth of the circuit is limited by the time constant formed by the product of $R_b$ and the parasitic capacitance at the input of $A_1$ to ground. It may be noted, however, that the circuit of FIG. 17 is largely immune, by virtue of $A_1$'s high input impedance, to the slow recovery problem plaguing the circuit of FIG. 16.

In another embodiment of the diffuse infrared signal detecting circuit (FIG. 18), a second amplifier $A_2$ and feedback resistor $R_x$ are added to the previous circuit. As above, amplifier $A_1$ is a non-inverting amplifier having a gain of slightly less than unity and a bandwidth of at least 12 MHz. The input impedance of A1 should be at least 200 k$\Omega$ and the output impedance less than 200$\Omega$.

Amplifier $A_2$ is an inverting amplifier having a gain of at least 30–40 volts per volt and a bandwidth of at least 12 MHz. The input impedance of $A_2$ should be at least 10–20 higher times than the output impedance of $A_1$.

Operation of the circuit shown in FIG. 18 is very similar to the circuit shown in FIG. 17. The addition of amplifier $A_2$ and feedback resistor $R_x$ serve to impose a virtual ground at the input of $A_1$. The floating photodiode PD, on the other hand, eliminate the parasitic capacitor $C_{PD}$ as a limiting factor because of the very small signal voltage appearing across the capacitor $C_{PD}$. The noise gain of $A_2$ is also reduced for the same reason. From the perspective of the circuit shown in FIG. 17, the virtual ground at the input of the first amplifier $A_1$ of the circuit of FIG. 18 allows for higher bandwidth and higher transimpedance gain than under the circuit of FIG. 17 because it is now the effective impedance of $A_1$, and not the much larger $R_b$, which interacts with the stray capacitance at the input of the first amplifier $A_1$.

FIG. 19 is an IR diffuse signal detector in accordance with another embodiment of the invention. In FIG. 19 the supply resistor $R_b$ has been divided into two smaller resistors $R_1$ and $R_2$. The embodiment seeks to improve the recovery time of the detector of FIG. 18 by dividing $R_b$ into two smaller resistors $R_1$ and $R_2$ where $R_2$ is a small fraction of $R_1$. Capacitor $C_1$, under the embodiment, couples signal voltage from the low impedance output of unity gain amplifier $A_1$ to the junction of $R_1$ and $R_2$. Because $C_1$ and $C_2$ are shorts at the signalling frequency (4 MHz) of the system 10, the signalling voltage at the cathode of the photodiode PD is substantially equal to the signalling voltage at the input of the amplifier $A_1$. Because $A_1$ is substantially a unity gain amplifier, the output of $A_1$ is substantially equal to the input. Because the reactance of $C_1$ is much less than $R_1$ at the signalling frequency, the charge required to change the voltage across $C_2$ is supplied by $C_1$ through $R_2$. Since $R_2$ is relatively small, the time required for the circuit of FIG. 19 to react to changes in ambient light levels is very fast.

While the circuit of FIG. 19 presents a means of signal detection that, at first blush, may appear to be an improvement, the performance of the circuit of FIG. 19 is still less than that desired. While $C_1$ does serve to supply charging current to $C_2$, a new RC circuit has been created through the interaction of $R_1$ and $C_1$.

To solve the problem of the circuit of FIG. 19, the circuit of FIG. 19 is re-arranged somewhat in FIG. 20 to provide an embodiment of an IR diffuse detection circuit 202 not subject to time delays caused by coupling capacitors. The alteration is a subtle but critical change. The supply resistor $R_b$ is still present but (as with FIG. 19) split into two smaller resistors $R_1$ and $R_2$.

The embodiment (FIG. 20) uses the photodiode PD to isolate $R_1C_1$ from $R_2C_2$. The result is to produce two almost independent RC time constants, each of which is quite short and, through proper component selection, may be made substantially equal. Because the two RC networks do not overlay one another (as in the previous approach), definite, independent bounds can be placed on the time constants.

In review, it can now be seen that the infrared detection circuits of FIG. 17, 18, and 20 represent a significant advance of the circuit of FIG. 16. Where the circuits of FIGS. 17, 18, and 20 are combined with the other elements of FIG. 15, the result is a diffuse infrared communication system receiver that is capable of detecting high-speed infrared signals at substantially above 4 MHz, either line of sight or as reflections from the walls of an enclosure 11.

The present invention provides a diffuse infrared local area communication system for a data communication network which efficiently utilizes a single channel even when only a fraction of the users have data messages to send at a given time. The diffuse infrared local area communication system is particularly adapted for use with a large number of portable battery-powered computer devices communicating with a central station via an infrared link.

While specific embodiments of the present invention have been shown and described herein, further modifications and improvements may be made by those skilled in the art. All such modifications which retain the basic underlying principles disclosed and claimed herein are within the scope of the invention.

What is claimed is:

1. A wireless diffuse infrared communication system for enclosed areas comprising:

a controller;

a substantially omnidirectional diffuse infrared transceiver disposed inside the enclosed area, operatively interconnected with the controller and simultaneously transmitting a diffuse infrared signal throughout the enclosed area;

a portable remote station; and a floating photodiode amplifier circuit disposed within the remote station, for transceiving the diffuse communicated signal with the substantially omnidirectional diffuse infrared transceiver.

2. A wireless diffuse infrared communication system for enclosed areas comprising:

a controller;

a substantially .omnidirectional diffuse infrared transceiver disposed inside the enclosed area operatively interconnected with the controller, including a photodiode for receiving diffuse infrared information, an radio frequency shield disposed over, and substantially enclosing the photodiode, and a floating photodiode amplifier operably interconnected with the photodiode;

a portable remote station; and means disposed within the remote station for tranceiving a diffuse communicated signal with the substantially omnidirectional diffuse infrared transceiver, including a photodiode for receiving diffuse infrared information, an radio frequency shield disposed over, and substantially enclosing the photodiode, and a floating photodiode amplifier operably interconnected with the photodiode.

3. A wireless diffuse infrared communication system for enclosed areas comprising:

a controller;

a substantially omnidirectional diffuse infrared transceiver disposed inside the enclosed area, operatively interconnected with the controller and simultaneously transmitting a diffuse infrared signal throughout the enclosed area;

a portable remote station;

a shielded photodiode shielded from radio frequency interference disposed in the portable remote station; and a floating photoconductor amplifier coupled to the shielded photodiode.

4. A wireless diffuse infrared communication system for enclosed areas comprising:

a controller;

a substantially omnidirectional diffuse infrared transceiver disposed inside the enclosed area, operatively interconnected with the controller and simultaneously transmitting a diffuse infrared signal throughout the enclosed area;

a first photodiode having an anode and a cathode disposed within the omnidirectional diffuse infrared transceiver; and a first non-inverting amplifier of substantially unity gain, with an input of the first non-inverting amplifier operably coupled with the cathode of the first photodiode through a coupling capacitor and an output of the first non-inverting amplifier operably coupled to an anode of the first photodiode;

a portable remote station;

a second photodiode having an anode and a cathode disposed within the portable remote station; and a second non-inverting amplifier of substantially unity gain, with an input of the second non-inverting amplifier operably coupled with the cathode of the second photodiode through a coupling capacitor and an output of the second non-inverting amplifier operably coupled to an anode of the second photodiode.

5. The system of claim 4 further comprising a feedback resistor interposed within the interconnection between the output of the non-inverting amplifier and the anode of the photodiode.

* * * * *